United States Patent
Sheats et al.

[11] Patent Number: 6,146,225
[45] Date of Patent: Nov. 14, 2000

[54] TRANSPARENT, FLEXIBLE PERMEABILITY BARRIER FOR ORGANIC ELECTROLUMINESCENT DEVICES

[75] Inventors: James R. Sheats; Mark R. Hueschen; Karen L. Seaward, all of Palo Alto; Daniel B. Roitman, Menlo Park, all of Calif.; George Andrew Davidson Briggs, Oxford, United Kingdom

[73] Assignee: Agilent Technologies, Inc., Palo Alto, Calif.

[21] Appl. No.: 09/126,689

[22] Filed: Jul. 30, 1998

[51] Int. Cl.⁷ ................................................. H05B 33/10
[52] U.S. Cl. ............................................. 445/24; 445/58
[58] Field of Search ......................................... 445/24, 58

[56] References Cited

U.S. PATENT DOCUMENTS

| | | |
|---|---|---|
| 4,842,893 | 6/1989 | Yializis et al. .......................... 427/44 |
| 4,954,371 | 9/1990 | Yializis ................................. 427/44 |
| 5,260,095 | 11/1993 | Affinito ................................. 427/124 |

*Primary Examiner*—Kenneth J. Ramsey

[57] ABSTRACT

A barrier for preventing water or oxygen from a source thereof from reaching a device that is sensitive to water or oxygen. The barrier is constructed by depositing a first polymer layer between the device and the source. An inorganic layer is deposited on the first polymer layer of the device by plasma enhanced chemical vapor deposition utilizing an electron cyclotron resonance source ECR-PECVD. A second polymer layer is then deposited on the inorganic layer. The inorganic layer is preferably an oxide or nitride. A second barrier layer having a compound that absorbs oxygen or water can be placed between the inorganic layer and the device to further retard the passage of oxygen or water. The present invention is particularly useful in encapsulating electroluminescent displays.

11 Claims, 2 Drawing Sheets

TRANSPARENT, FLEXIBLE PERMEABILITY BARRIER FOR ORGANIC ELECTROLUMINESCENT DEVICES

The present invention relates to electroluminescent devices, and more particularly, to an improved method for sealing an organic light emitting display to increase the lifetime of the display.

BACKGROUND OF THE INVENTION

Organic light emitting devices (OLEDs) are emissive displays consisting of a transparent substrate coated with a transparent conducting material, such as Indium Tin oxide (ITO), one or more organic layers, and a cathode made by evaporating or sputtering a metal of low work function characteristics, such as Ca or Mg. The organic layers are chosen so as to provide charge injection and transport from both electrodes into the electroluminescent organic layer (EL) where the charges recombine, emitting light. There may be one or more organic hole transport layers (HTL) between the ITO and the EL, as well as one or more electron injection and transporting layers (EL) between the cathode and the EL.

OLEDs hold out the promise of providing inexpensive displays. In principle, these devices can be manufactured on flexible substrates and fabricated using "roll-to-roll" processing equipment. Inexpensive equipment for such fabrication operations such as polymer film coating devices, metal evaporators and lithography equipment capable of providing the deposition of the various layers are already available. For example, Web coating devices for thin polymer films that are a few feet wide can operate at a feed rate of hundreds of feed per minute.

To function over extended periods of time, an OLED must be sealed to prevent water and oxygen from reaching the cathode and polymer layers. Unfortunately, polymers having sufficiently low permeability to water and oxygen are not available. For example, Poly(ethylene terephthalate) or PET, which is used as a command substrate for Web processing has a water permeability that is so high that devices constructed thereon begin to degrade almost immediately due to reaction of water from the air with the cathode material. Accordingly, some form of sealant coating must be applied to the polymer to achieve the required resistance to water and oxygen. In addition, the cathode layer must be sealed on the other side of the device to prevent water and oxygen from entering from that side and destroying the cathode.

One coating technique that has shown promise is the Polymer Multilayer (PML) technique described in U.S. Pat. Nos. 4,842,893, 4,954,371, and 5,260,095. In this technique, a coating consisting of a layer of polymer and an layer of an aluminum oxide is applied to the flexible substrate to seal the substrate. Both the deposition steps can be operated on Web processing equipment at very high speeds. While the resistance to water and oxygen permeation is improved by three to four orders of magnitude relative to uncoated PET films, the resulting films are still sufficiently permeable to limit the lifetime of the OLEDs in application requiring lifetimes of several years and/or exposure to hot humid environments. Using accelerated lifetime test procedures, it can be shown that the permeation rate should not exceed about $4 \times 10^{-7}$ moles $H_2 O/m^2$ day in order to have a storage lifetime of 10 years. The best films currently available have permeabilities that are at least a factor of 50 too high. It should be noted that applying several polymer bilayers does not improve the resistance to water and oxygen sufficiently to provide the required increase in resistance.

Broadly, it is the object of the present invention to provide an improved OLED display and method for making the same.

It is a further object of the present invention to provide a method for constructing a PML that has sufficient resistance to water and oxygen permeation to provide OLEDs having commercially useful lifetimes.

These and other objects of the present invention will become apparent to those skilled in the art from the following detailed description of the invention and the accompanying drawings.

SUMMARY OF THE INVENTION

The present invention is a barrier for preventing water or oxygen from reaching a device that is sensitive to water or oxygen. The barrier is constructed by depositing a first polymer layer between the device and the source. An inorganic layer is deposited on the first polymer layer of the device by plasma enhanced chemical vapor deposition utilizing an electron cyclotron resonance source ECR-PECVD. A second polymer layer is then deposited on the inorganic layer. The inorganic layer is preferably an oxide or nitride. A second barrier layer having a compound that absorbs oxygen or water can be placed between the inorganic layer and the device to further retard the passage of oxygen or water. The present invention is particularly useful in encapsulating electroluminescent displays.

DETAILED DESCRIPTION OF THE INVENTION

Figure 1:
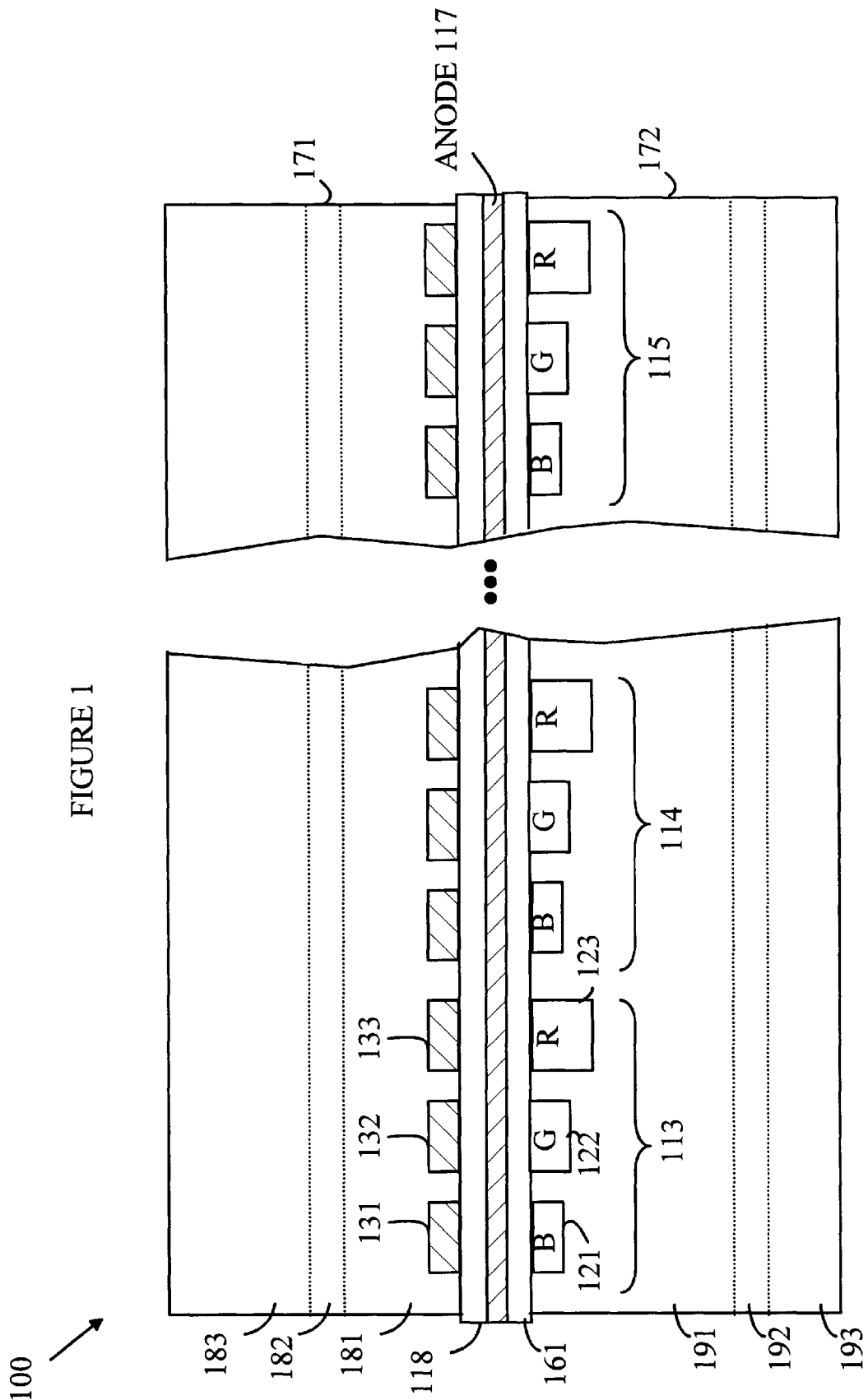
FIG. 1 is a cross-sectional view of a portion of an OLED display according to the present invention.

The manner in which the present invention gains its advantages may be more easily understood with reference to FIG. 1 which is a cross-sectional view of a portion of an OLED display 100 according to the present invention based on the color conversion methodology. Display 100 is constructed on a plastic substrate 161 such as the PET substrate material discussed above. The light that is converted to the primary colors is generated in an EL layer 118. The light in EL layer 118 is generated by connecting row and column electrodes to the appropriate power supplies. For the purposes of this discussion, the row electrodes 117 will be assumed to be the anode of the device, and the column electrodes will be assumed to be the cathode. The cross-sectional view shown in FIG. 1 is taken through one row electrode. The column electrodes run at right angles to the row electrodes. Typical column electrodes are shown at 131–133. Light generated at the intersection of a row and column electrode illuminates a color conversion strip that lies below the column electrode. The color conversion strips corresponding to electrodes 131–133 are shown at 121–123, respectively. Strip 121 converts the light emitted by layer 118 to blue light. Similarly, strip 122 converts the emitted light to green, and strip 123 converts the emitted light to red. The portion of the display shown in FIG. 1 includes the column electrodes for three full color pixels shown at 113–115.

The various organic layers that make up the light emitting and injection layers are deposited over the patterned anode electrodes. To simplify the drawing, these layers are shown as a single light emitting layer 118; however, it is to be understood that layer 118 may be constructed of a number of sub-layers that facilitate the injection of holes and electrons into an EL layer as described above. Since the fabrication of such a multilayer structure is conventional in the art, it will not be discussed in detail here. It is sufficient to note that the layers can be deposited by spin casting, dye sublimation, web coating, or various "printing" techniques depending on the particular material system chosen.

The cathode lines are constructed from a low work-function material such as calcium or magnesium. Shadow masking techniques for depositing such electrodes are also well known in the art, and hence, will not be discussed in detail here.

As noted above, the final displays need to be encapsulated to prevent oxygen and moisture from penetrating to the cathode electrodes and the light emitting layers. Such encapsulation layers are shown at 171 and 172 in FIG. 1. In the present invention, the encapsulating layers are constructed as PML layers analogous to those described above. Each encapsulation layer includes two polymer layers and a layer of inorganic oxide or nitride sandwiched therebetween. The polymer layers corresponding to encapsulation layer 171 are shown at 181 and 183, respectively. The oxide or nitride layer corresponding to encapsulation layer 171 is shown at 182. Similarly, the polymer and oxide or nitride layers corresponding to encapsulation layer 172 are shown at 191, 193, and 192, respectively.

The polymer layers are deposited by evaporating a monomer for the polymer into a coating chamber, which is typically evacuated. The portion of the device that is to be coated is maintained at a temperature below the boiling point of the monomer by contacting that portion with a cold surface, typically a roller that the device is moving over during the coating process. The monomer solution condenses on the device forming a uniform liquid coat that fills in the various gaps thereby planarizing the surface. The monomers are then cross-linked by exposure to a radiation source such as a UV lamp. The deposition of the polymer layers is discussed in detail in the above-cited patents, which are hereby incorporated by reference, and hence, will not be discussed in further detail here. It is sufficient to note that the resulting polymer surface is exceptionally smooth.

The inorganic oxide is applied over the polymerized polymer surface. In prior art encapsulation systems utilizing the PML technology, the oxide was applied by sputtering or evaporation. The extremely smooth polymer surface provides a low defect surface for the application of the oxide. Accordingly, the oxide has relatively few pinholes through which oxygen or water can travel. However, the oxide layer still passes sufficient oxygen and/or water to limit the device lifetime. The present invention overcomes this limitation.

The permeability of the oxide layer is determined both by the density of pinholes in the layer and density of the oxide material. The PML technology addresses the pinhole problem; however, the deposition techniques utilized in the prior art systems do not provide a sufficiently dense oxide layer to limit permeability to the desired levels. The present invention is based on the observation that oxide or nitride layers deposited by plasma enhanced chemical vapor deposition utilizing a high density plasma, particularly an electron cyclotron resonance source (ECR-PECVD) have significantly higher densities than those deposited by the methods taught in the prior art, while allowing deposition under conditions that do not damage the underlying polymer layers.

High-density plasmas are characterized as having a very small sheath voltage, on the order of 5 times the electron temperature in eV, at surfaces containing the plasma. This is in contrast with low density plasmas which have capacitive coupling and high sheath voltages at walls. In capacitive plasmas the power into the plasma is coupled to the potential of ions striking the walls. In high-density plasmas, the potential of ions striking the walls is inherently very low and can be controlled by adding capacitively coupled power at the substrate. Hence, a high-density plasma provides a high flux of low energy ions along with a high flux of reactive species that are generated at the surface to be coated. This enables the deposition of usable dielectrics at temperatures compatible with polymers. Dielectrics such as silicon nitride, silicon dioxide, aluminum oxide, silicon carbide, silicon oxynitride, and such can be deposited utilizing this technique.

A number of high-density plasma systems are available. For example, such systems may be purchased from PlasmaQuest, Plasma-Therm, Surface Technology Systems, Trikon, Lam Research, Applied Materials, Tegal and Novellus.

ECR is not necessary to create a high-density plasma and other schemes have been commercialized such as Inductively Coupled Plasma, Helical Resonator, and Helicon plasma. As an example for illustration only, we have found that an Oxford Instruments ECR system, using silane, argon and nitrogen as source gases at a pressure of between 5 and 10 mTorr, with 700 Watts of 2.45 GHz microwave power and a magnetic field of about 875 Gauss, gave excellent results as described below. These operating parameters may be varied considerably as will be evident to those skilled in the art, to optimize conditions for particular substrates.

To demonstrate the present invention, a silicon nitride film was deposited by this technique on a thin calcium film (about 200 angstroms, prepared by thermal evaporation of calcium) on glass. The temperature of the film was maintained below 80° C. by a cooling stage. Upon exposure to air, the metal adjacent to pinholes became transparent, and the transparent diameter grew slowly larger with time. The remaining metal, however, was unchanged in appearance in the microscope after 20 days. Given that a reaction of even 1% of the calcium would be visible (because of the surface disturbance), this observation gives an upper limit to the permeation rate of about $8 \times 10^{-7}$ moles $H_2$ $O/m^2$ day. The etch rate of the film in a 10% (by volume) aqueous HF solution, which is a good measure of its morphological quality, was 120 nm/min, which by comparison with published data (Y. Tessier, et al., Mat. Res. Soc. Symp. Proc. Vol. 86, 1986, p. 183) is indicative of a water permeability of around $1 \times 10^{-8}$ mol/m$^2$ day, 40 times better than the requirement for organic LEDs.

A further important advantage of the present invention is that the stress of the deposited inorganic film can be varied, depending on the parameters such as the microwave power and gas pressure. The reduced stress reduces the distortions of the patterned elements and prevents delamination or distortion as the substrate is rolled up during roll-to-roll processing. The example film had a stress of $2.5 \times 10^{-9}$ dynes/cm$^2$, which is quite low.

A further advantage of the present invention is an improved deposition rate over the prior art methods discussed above. With the method of the present invention, rates of more than 1 micron per minute can be achieved. Since the deposition rate determines the maximum rate at which the roll-to-roll processing equipment can operate, the present invention provides increased throughput.

In the preferred embodiment of the present invention, the polymer layers are constructed from an acrylic monomer, such as methyl methacrylate, ethylene glycol diacrylate, or other acrylates, diacrylates, and triacrylates or methacrylates having a thickness of about 1 micron. The oxide layer is preferably silicon nitride having a thickness of 350 Å. However, embodiments utilizing other oxides or nitrides may also be constructed. For example, layers 182 and 192 can be constructed from silicon or aluminum oxides or aluminum nitride. The second polymer layer is used to protect the nitride layer from subsequent damage during use and processing. This layer is also preferably constructed from an acrylic monomer having a thickness of 0.25 microns or greater. However, in both polymer layers, other monomers, such as carbonates, fluorinated alkenes, or other liquid monomers that can be cured to an insoluble film, can be utilized While the above-described embodiments of the present invention utilize an encapsulation layer that is on the opposite side of the substrate film from the anode electrodes, embodiments in which the substrate is coated with a PML film and the anode applied to the polymer layer may also be constructed. In general, the smooth surface provided by the polymer layer is superior to that provided by a PET substrate. Hence, the resultant anode electrodes have fewer defects than those obtained by application of the ITO layer directly to the PET. In addition, the PET coated substrate can be prepared separately and stored, thereby relieving the manufacturer of the OLED device of the need to perform the first encapsulation operation.

The barrier system of the present invention may be further enhanced by including a layer that absorbs oxygen and/or water. Such a "getter" layer can be constructed by providing a layer of material that reacts with oxygen or water that penetrates the layer and thereby removes the oxygen or water before it reaches the display device. In the simplest embodiment, a small amount of a getter compound is included in the oxide or nitride layer itself For example, a low concentration of metallic lithium can be added to an oxide or nitride layer that is formed by co-evaporation or co-sputtering from two sources.

The concentration must be sufficiently low to maintain the transparency of the barrier if the layer is on the light emitting side of the device. The lithium will react with oxygen and/or water until the metallic lithium is expended, and the permeability of the layer will be lower than it was initially, because the free volume is now occupied by the chemically bound oxygen atoms. Hence, the device will be further protected for some period of time from oxygen or water that would have otherwise penetrated the barrier.

Figure 2:
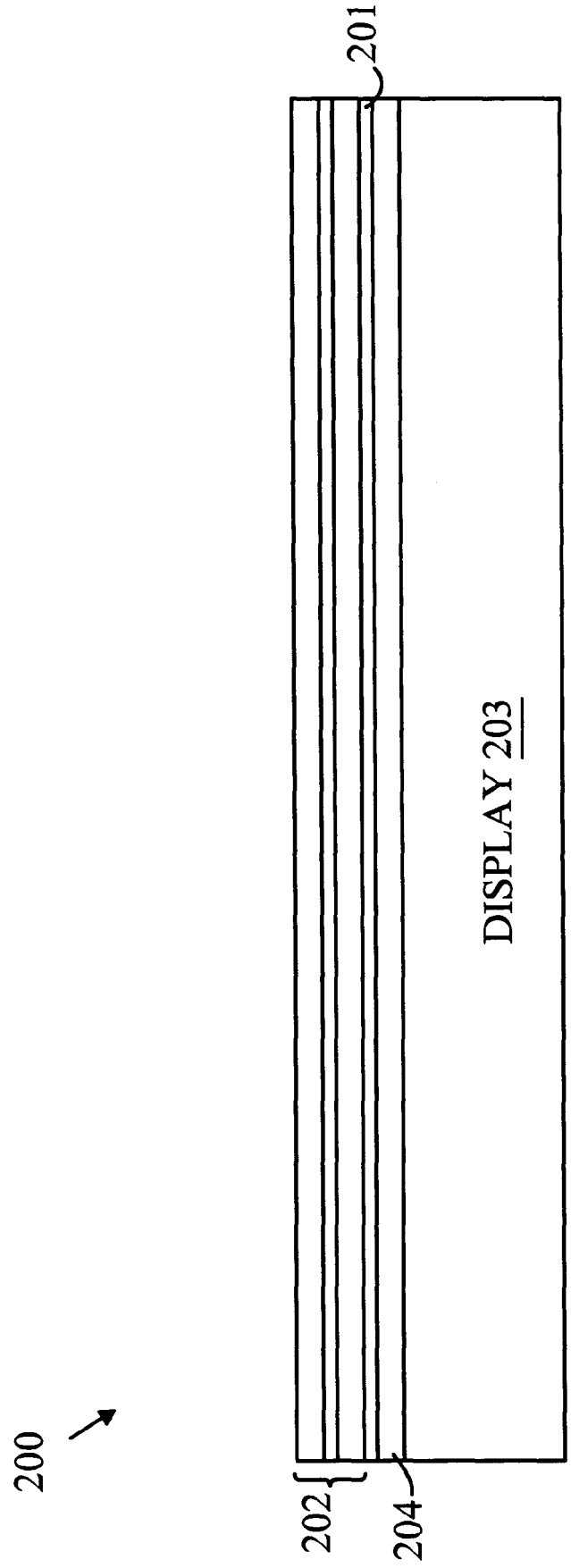
FIG. 2 is a cross-sectional view of a device that is further protected by an oxygen or water absorption layer.

Alternatively, the getter layer can be placed between the barrier and the device as a separate layer as shown in FIG. 2 at 200. In this case, a separate layer of getter material 201 is placed between the PML barrier layer 202 and the device 203. An additional polymer layer 204 may be utilized to separate the getter layer from the device. A similar structure is provided on the other side of the device to prevent oxygen and/or water from penetrating from that side as well. The PML smoothing layer improves the quality of the getter layer compared to those described in the prior art, for example in the U.S. Pat. Nos. 5,047,687 and 5,059,861. The getter material may be any metal that reacts rapidly with water, such as calcium, magnesium, or any alkali metal. Because the metals are protected by the PML-based water/oxygen barrier, highly reactive metals that are otherwise hard to handle may be used.

The barrier system of the present invention has been described in terms of preventing water or oxygen from reaching the active layers of an OLED. However, it will be obvious to those skilled in the art from the preceding discussion that the method of the present invention may be used to provide an oxygen or water barrier for other types of devices or films.

Various modifications to the present invention will become apparent to those skilled in the art from the foregoing description and accompanying drawings. Accordingly, the present invention is to be limited solely by the scope of the following claims.

What is claimed is:

1. A method for preventing water or oxygen from a source thereof reaching a device, said method comprising the steps of:

depositing a first polymer layer between said device and said source;

depositing an inorganic layer on said first polymer layer of said device by ECR-PECVD; and depositing a second polymer layer on said inorganic layer.

2. The method of claim 1 wherein said inorganic layer comprises an oxide.

3. The method of claim 2 wherein said oxide comprises an aluminum oxide or a silicon oxide.

4. The method of claim 1 wherein said inorganic layer comprises a nitride.

5. The method of claim 4 wherein said nitride comprises an aluminum nitride or a silicon nitride.

6. The method of claim 1 wherein said inorganic layer comprises an oxynitride.

7. The method of claim 6 wherein said oxynitride comprises an aluminum oxynitride or a silicon oxynitride.

8. The method of claim 1 further comprising the step of depositing a layer of material that absorbs oxygen or water between said inorganic layer and said device.

9. The method of claim 8 wherein said absorbing material comprises a metal uniformly dispersed in an oxide or nitride.

10. The method of claim 1 wherein said inorganic layer further comprises a material that absorbs oxygen or water.

11. The method of claim 10 wherein said absorption material comprises a metal.

* * * * *

UNITED STATES PATENT AND TRADEMARK OFFICE
CERTIFICATE OF CORRECTION

PATENT NO. : 6,146,225
DATED : July 30, 1998
INVENTOR(S) : James R. Sheats, Mark R. Hueschen, Karen Seaward, and Daniel B. Roitman It is certified that error appears in the above-identified patent and that said Letters Patent is hereby corrected as shown below:

Title page,
The inventor information should read -- James R. Sheats, Mark R. Hueschen, Karen Seaward, all of Palo Alto; Daniel B. Roitman, Menlo Park; all of California Signed and Sealed this Twenty-fifth Day of December, 2001

Attest:

JAMES E. ROGAN
Attesting Officer
Director of the United States Patent and Trademark Office